(12) United States Patent
Lai et al.

(10) Patent No.: US 10,852,810 B2
(45) Date of Patent: *Dec. 1, 2020

(54) ADAPTIVE POWER DOWN OF INTRA-CHIP INTERCONNECT

(71) Applicant: Microsoft Technology Licensing, LLC, Redmond, WA (US)

(72) Inventors: Patrick P. Lai, Fremont, CA (US); Robert Allen Shearer, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/294,755

(22) Filed: Mar. 6, 2019

(65) Prior Publication Data

US 2019/0204898 A1 Jul. 4, 2019

Related U.S. Application Data

(63) Continuation of application No. 15/620,950, filed on Jun. 13, 2017, now Pat. No. 10,241,561.

(51) Int. Cl.
| | | |
|---|---|---|
| *G06F 1/32* | (2019.01) | |
| *G06F 1/3234* | (2019.01) | |
| *G11C 5/14* | (2006.01) | |
| *G06F 1/3246* | (2019.01) | |
| *G06F 1/3203* | (2019.01) | |
| *G06F 1/3293* | (2019.01) | |
| *G06F 12/0897* | (2016.01) | |
| *G06F 1/3287* | (2019.01) | |

(52) U.S. Cl.
CPC .......... *G06F 1/3275* (2013.01); *G06F 1/3203* (2013.01); *G06F 1/3243* (2013.01); *G06F 1/3246* (2013.01); *G06F 1/3287* (2013.01); *G06F 1/3293* (2013.01); *G06F 12/0897* (2013.01); *G11C 5/148* (2013.01); *G06F 2212/1028* (2013.01)

(58) Field of Classification Search
None
See application file for complete search history.

(56) References Cited

U.S. PATENT DOCUMENTS

| | | |
|---|---|---|
| 8,990,505 B1 | 3/2015 | Jamil et al. |
| 2005/0246508 A1 | 11/2005 | Shaw |

OTHER PUBLICATIONS

"Non Final Office Action Issued in U.S. Appl. No. 15/414,540", dated May 17, 2019, 16 Pages.

*Primary Examiner* — Kevin Verbrugge
(74) *Attorney, Agent, or Firm* — Alleman Hall Creasman & Tuttle LLP

(57) ABSTRACT

An integrated circuit comprising a plurality of last-level caches, a plurality of processor cores configured to access data in the plurality of last-level caches, and an interconnect network. The plurality of last-level caches can be placed in at least a high cache-power consumption mode and a low cache-power consumption mode. The plurality of last-level caches includes a first last-level cache and a second last-level cache. The interconnect network comprises a plurality of links that can be placed in at least a high link-power consumption mode and a low link-power consumption mode. The interconnect network is configured to cause a first subset of the plurality of links to be placed in the low link-power consumption mode based at least in part on the first last-level cache being in the low cache-power consumption mode.

20 Claims, 11 Drawing Sheets

# US 10,852,810 B2

ADAPTIVE POWER DOWN OF INTRA-CHIP INTERCONNECT

CROSS REFERENCE TO RELATED APPLICATIONS

This application is a continuation of U.S. patent application Ser. No. 15/620,950, filed Jun. 13, 2017, the entire contents of which is hereby incorporated herein by reference for all purposes.

BACKGROUND

Integrated circuits, and systems-on-a-chip (SoC) may include multiple independent processing units (a.k.a., "cores") that read and execute instructions. These multi-core processing chips typically cooperate to implement multiprocessing. To facilitate this cooperation, and to improve performance, these processing cores may be interconnected. Various network topologies may be used to interconnect the processing cores. This includes, but is not limited to, mesh, crossbar, star, ring, and/or hybrids of one or more of these topologies.

SUMMARY

Examples discussed herein relate to an integrated circuit that includes a plurality of last-level caches, a plurality of processor cores, and an interconnect network. The plurality of last-level caches can be placed in at least a first high cache-power consumption mode and a first low cache-power consumption mode. The plurality of last-level caches include at least a first last-level cache and a second last-level cache. The plurality of processor cores access data in the plurality of last-level caches. The interconnect network includes a plurality of point-to-point links. These point-to-point links can be placed in at least a first high link-power consumption mode and a first low link-power consumption mode. The plurality of point-to-point links receive access addresses from the plurality of processor cores and couple, via respective subsets of the plurality of point-to-point links, each of the plurality of processor cores to a respective one of the plurality of last-level caches. A first subset of the plurality of point-to-point links are placed in the first low link-power consumption mode based at least in part on the first last-level cache being in the first low cache-power consumption mode.

In another example, a method of operating a processing system having a plurality of processor cores includes, based at least in part on a first set of last-level caches of a plurality of last-level caches being in a first power-consumption mode, using a first set of links to route accesses by a first processor core of the plurality of processor cores to the first set of last-level caches. The method also includes, based at least in part on a second set of last-level caches of the plurality of last-level caches being in the first power-consumption mode, using a second set of links to route accesses by the first processor core to the second set of last-level caches.

In another example, a method of operating a plurality of processor cores on an integrated circuit includes distributing accesses by a first processor core to a first set of last-level caches of a plurality of last-level caches using a first set of links that are in a first power consumption mode. The first processor core being associated with a first last-level cache of the plurality of last-level caches. The method also includes distributing accesses by a second processor core to the first set of last-level caches using the first set of links that are in the first power consumption mode. The second processor core being associated with a second last-level cache of the plurality of last-level caches. The second last-level cache is placed in a second power-consumption mode. While the second last-level cache is in the second power-consumption mode, accesses by the first processor core are distributed to a second set of last-level caches using a second set of links that are in the first power consumption mode. The second set of links not providing a path to distribute accesses by the first processor core to the second last-level cache.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

In order to describe the manner in which the above-recited and other advantages and features can be obtained, a more particular description is set forth and will be rendered by reference to specific examples thereof which are illustrated in the appended drawings. Understanding that these drawings depict only typical examples and are not therefore to be considered to be limiting of its scope, implementations will be described and explained with additional specificity and detail through the use of the accompanying drawings.

DETAILED DESCRIPTION OF THE EMBODIMENTS

Figure 1A:
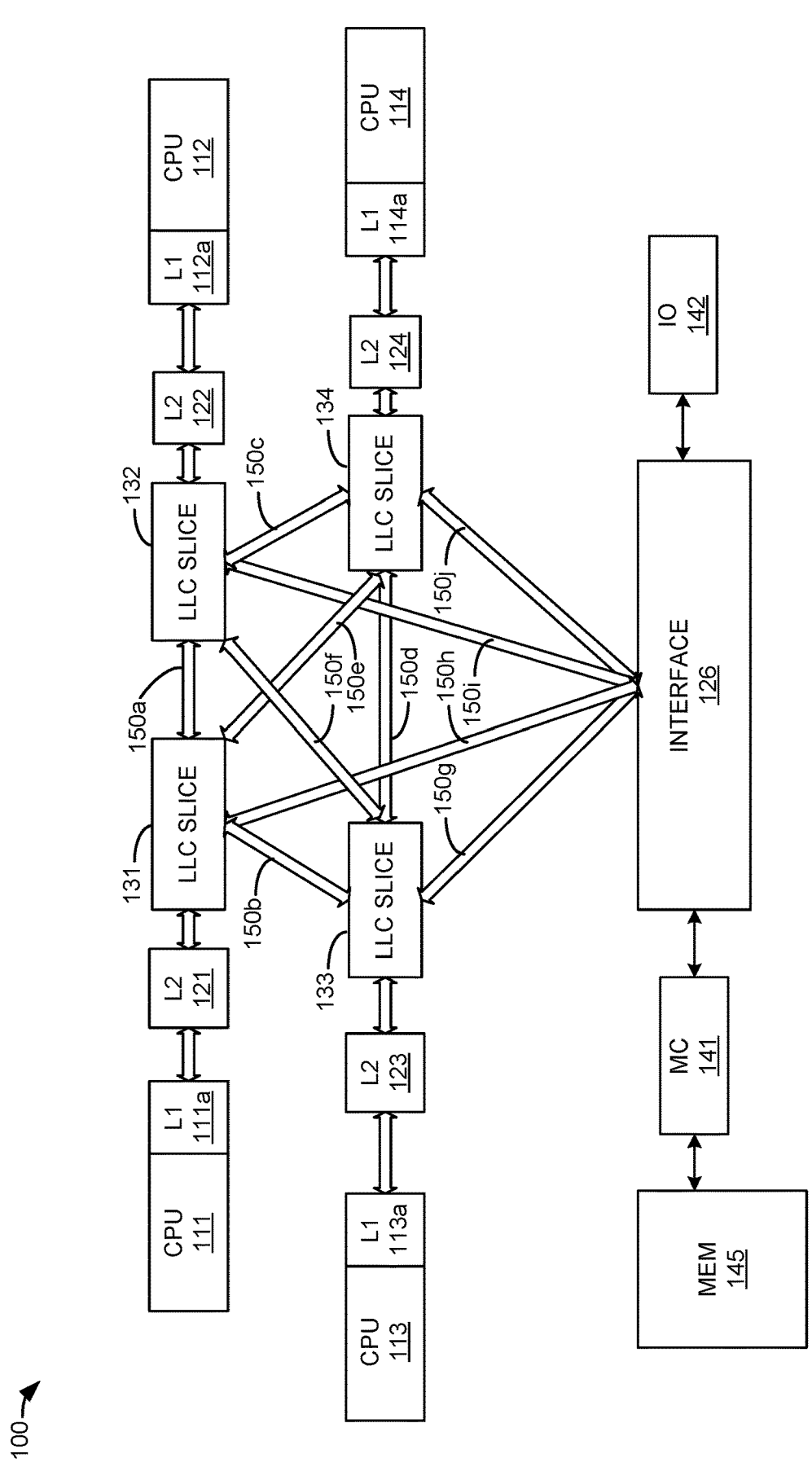
FIGS. 1A-1D are block diagrams illustrating a processing system and operating modes.

Examples are discussed in detail below. While specific implementations are discussed, it should be understood that this is done for illustration purposes only. A person skilled in the relevant art will recognize that other components and configurations may be used without parting from the spirit and scope of the subject matter of this disclosure. The implementations may be a machine-implemented method, a computing device, or an integrated circuit.

In a multi-core processing chip, the last-level cache may be implemented by multiple last-level caches (a.k.a. cache slices) that are interconnected, but physically and logically distributed. The interconnection network provides links to exchange data between the various last-level caches. The various processors of the chip decide which last-level cache is to hold a given data block by applying a hash function to the physical address.

In an embodiment, to reduce power consumption, it is desirable to shut down (and eventually restart) one of more of the last-level caches and the links that connect to that last-level cache. The hash function used by the processors on a chip to distribute accesses to the various last-level caches via the links is changed according to which last-level caches (and/or links) that are active (e.g., 'on') and which are in a lower power consumption mode (e.g., 'off'.) Thus, a first hash function is used to distribute accesses (i.e., reads and writes of data blocks) to all of the last-level caches and all of the links when, for example, all of the last-level caches are 'on.' A second hash function is used to distribute accesses to the appropriate subset of the last-level caches and corresponding subset of links when, for example, some of the last-level caches are 'off.' In this manner, data can be sent to only the active last-level caches via active links while not attempting to send data to the inactive last-level caches via inactive links.

As used herein, the term "processor" includes digital logic that executes operational instructions to perform a sequence of tasks. The instructions can be stored in firmware or software, and can represent anywhere from a very limited to a very general instruction set. A processor can be one of several "cores" (a.k.a., 'core processors') that are collocated on a common die or integrated circuit (IC) with other processors. In a multiple processor ("multi-processor") system, individual processors can be the same as or different than other processors, with potentially different performance characteristics (e.g., operating speed, heat dissipation, cache sizes, pin assignments, functional capabilities, and so forth). A set of "asymmetric" or "heterogeneous" processors refers to a set of two or more processors, where at least two processors in the set have different performance capabilities (or benchmark data). A set of "symmetric" or "homogeneous" processors refers to a set of two or more processors, where all of the processors in the set have the same performance capabilities (or benchmark data). As used in the claims below, and in the other parts of this disclosure, the terms "processor", "processor core", and "core processor", or simply "core" will generally be used interchangeably.

FIG. 1A is a block diagram illustrating a processing system. In FIG. 1, processing system 100 includes processor (CPU) 111, processor 112, processor 113, processor 114, level 2 (L2) caches 121-124, interface 126, last-level cache slices 131-134, interconnect network links 150a-150j, memory controller 141, input/output (IO) processor 142, and main memory 145. CPU 111 includes level 1 (L1) cache 111a. CPU 112 includes L1 cache 112a. CPU 113 includes L1 cache 113a. CPU 113 includes L1 cache 113a. CPU 114 includes L1 cache 114a. Processing system 100 may include additional processors, interfaces, caches, links, and IO processors (not shown in FIG. 1.)

As illustrated in FIG. 1, L2 cache 121 is operatively coupled between L1 cache 111a and last-level cache slice 131. L2 cache 122 is operatively coupled between L1 cache 112a and last-level cache slice 132. L2 cache 123 is operatively coupled between L1 cache 113a and last-level cache slice 133. L2 cache 124 is operatively coupled between L1 cache 114a and last-level cache slice 134.

Last-level cache slice 131 is operatively coupled to last-level cache slice 132 via link 150a. Last-level cache slice 131 is operatively coupled to last-level cache slice 133 via link 150b. Last-level cache slice 131 is operatively coupled to last-level cache slice 132 via link 150e. Last-level cache slice 131 is operatively coupled to interface 126 via link 150h.

Last-level cache slice 132 is operatively coupled to last-level cache slice 133 via link 150f. Last-level cache slice 132 is operatively coupled to last-level cache slice 134 via link 150c. Last-level cache slice 132 is operatively coupled to interface 126 via link 150i.

Last-level cache slice 133 is operatively coupled to last-level cache slice 134 via link 150d. Last-level cache slice 133 is operatively coupled to interface 126 via link 150g. Last-level cache slice 134 is operatively coupled to interface 126 via link 150j.

Memory controller 141 is operatively coupled to interface 126 and to main memory 145. IO processor 142 is operatively coupled to interface 126. Thus, for the example embodiment illustrated in FIG. 1, it should be understood that last-level caches 131-134 and interface 126 are arranged in a fully connected 'mesh' topology. Other network topologies (e.g., ring, crossbar, star, hybrid(s), etc.) may be employed.

Interconnect links 150a-150j operatively couple last-level cache slices 131-134 and interface 126 to each other, to IO processor 142 (via interface 126), and memory 145 (via interface 126 and memory controller 141.) Thus, data access operations (e.g., load, stores) and cache operations (e.g., snoops, evictions, flushes, etc.), by a processor 111-114, L2 cache 121-124, last-level cache 131-135, memory controller 141, and/or IO processor 142 may be exchanged with each other via interconnect links 150a-150j.

It should also be noted that for the example embodiment illustrated in FIG. 1, each one of last-level caches 131-134 is more tightly coupled to a respective processor 111-114 than the other processors 111-114. For example, for processor 111 to communicate a data access (e.g., cache line read/write) operation to last-level cache 131, the operation need only traverse L2 cache 121 to reach last-level cache 131 from processor 111. In contrast, to communicate a data access by processor 111 to last-level cache 132, the operation needs to traverse (at least) L2 cache 121, last-level cache slice 131, and link 150a. To communicate a data access by processor 111 to last-level cache 133, the operation needs to traverse (at least) L2 cache 121, last-level cache slice 131, and link 150b, and so on. In other words, each last-level cache 131-134 is associated with (or corresponds) to the respective processor 111-114 with the minimum number of intervening elements (i.e., a single L2 cache 121-124) between that last-level cache 131-134 and the respective processor 111-114.

In an embodiment, each of processors 111-114 distributes data blocks (e.g., cache lines) to last-level caches 131-134 via links 150a-150d according to at least two cache hash functions. For example, a first cache hash function may be used to distribute data blocks being used by at least one processor 111-114 to all of last-level caches 131-134 using all of the links 150a-150d that interconnect last-level caches 131-134 to each other. In another example, one or more (or all) of processors 111-114 may use a second cache hash function to distribute data blocks to less than all of last-level caches 131-134 using less than all of the links 150a-150d that interconnect last-level caches 131-134 to each other.

Provided all of processors 111-114 (or at least all of processors 111-114 that are actively reading/writing data to memory) are using the same cache hash function at any given time, data read/written by a given processor 111-114 will be found in the same last-level cache 131-134 regardless of which processor 111-115 is accessing the data. In other words, the data for a given physical address accessed by any of processors 111-115 will be found cached in the same last-level cache 131-134 regardless of which processor is making the access. The last-level cache 131-134 that holds (or will hold) the data for a given physical address is determined by the current cache hash function being used by processors 111-114, and interface 126. The current cache hash function being used by system 100 may be changed from time-to-time. The current cache hash function being used by system 100 may be changed from time-to-time in order to reduce power consumption by turning off (or placing in a lower power mode) one or more of last-level caches 131-134 and by turning off (or placing in a lower power mode) the links 150a-150j that connect to the 'off' caches 131-134.

In an embodiment, the cache hashing function used by processors 111-114 maps accesses during high power state to all of last-level caches 131-134. However, the mapping can be changed to only map to a single (or at least not all) last level cache slice 131-134 during low power states. This can significantly reduce power consumption by putting to sleep all other cache slices 131-134 and their SRAM structures. In addition, because power cache slices 131-134 can be dynamically powered down based on utilization and power state, there can be segments (links) of the on-chip network fabric 150a-150j connected to the cache slices t131-134 that are being put into sleep mode. Once the transition into the sleep mode completes, and queues and buffer drained, these fabric segments 150a-150j may be put to sleep or placed in a power down state.

The fabric segments 150a-150j not needed when one or more of cache slices 131-134 are powered down are also powered down to further conserve power. These segments are awoken when the need to wake up the cache slices already in sleep mode arises. The powering up and down of links 150a-150j can be done in a manner that is fully consistent with how we power down and wake up the cache slices—e.g., by at least changing the cache hashing function after draining queues and buffers associated with the cache slices 131-134 that are being put to sleep.

Figure 1B:
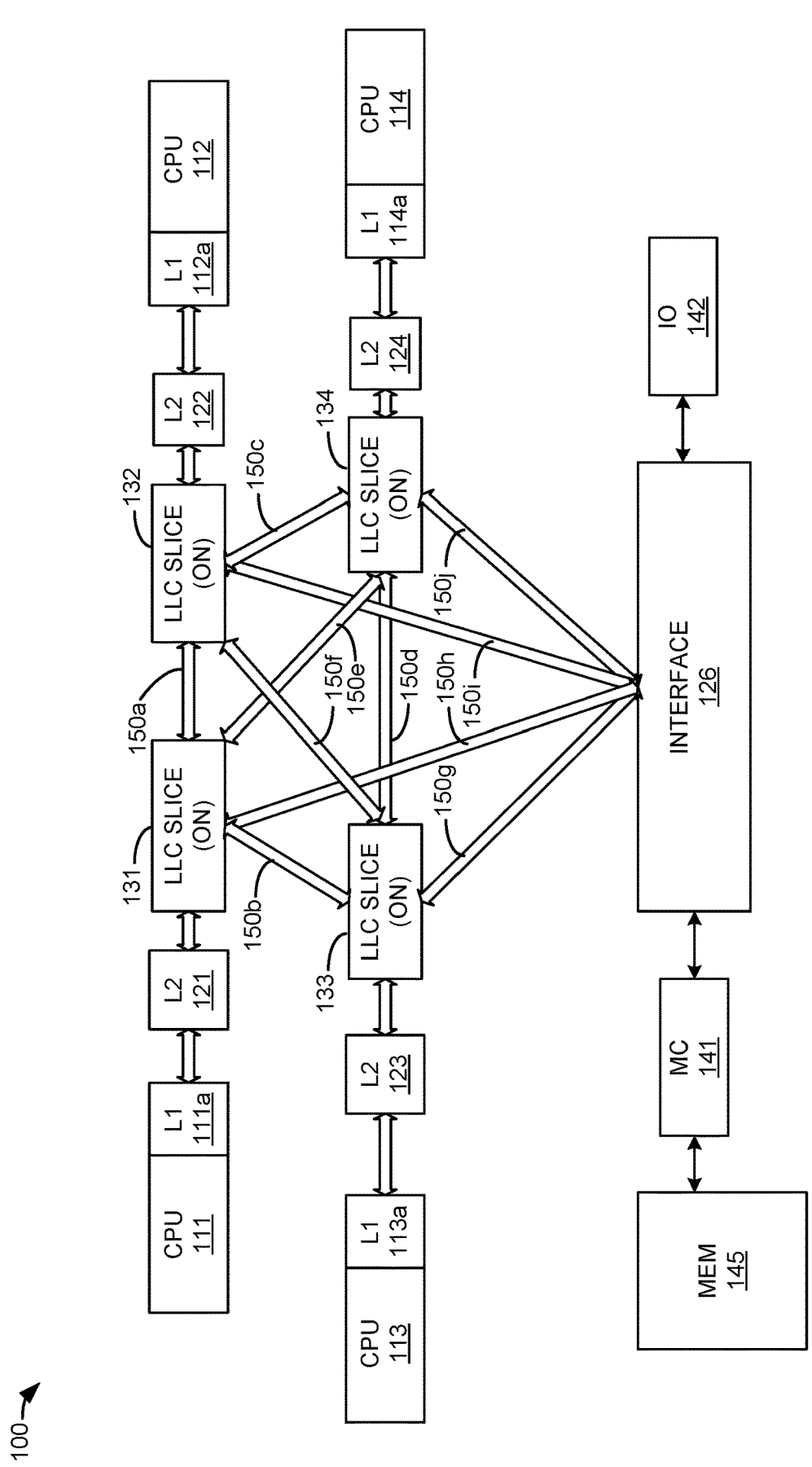

FIG. 1B is a diagram illustrating an example distribution of accesses to last-level caches using a first set of links. In FIG. 1B, all of last-level caches 131-134 are 'on'. To fully interconnect all of the 'on' last-level caches 131-134 and interface 126, all of links 150a-150j are active. This is illustrated by example in FIG. 1B by the solid white color of links 150a-150j. In FIG. 1B, processors 111-114 use a (first) cache hash function that distributes accessed data physical addresses to all of last-level caches 131-134—and thereby also uses all of links 150a-150j to implement a fully interconnected mesh network that links last-level caches 131-134 to each other and to interface 126.

Figure 1C:
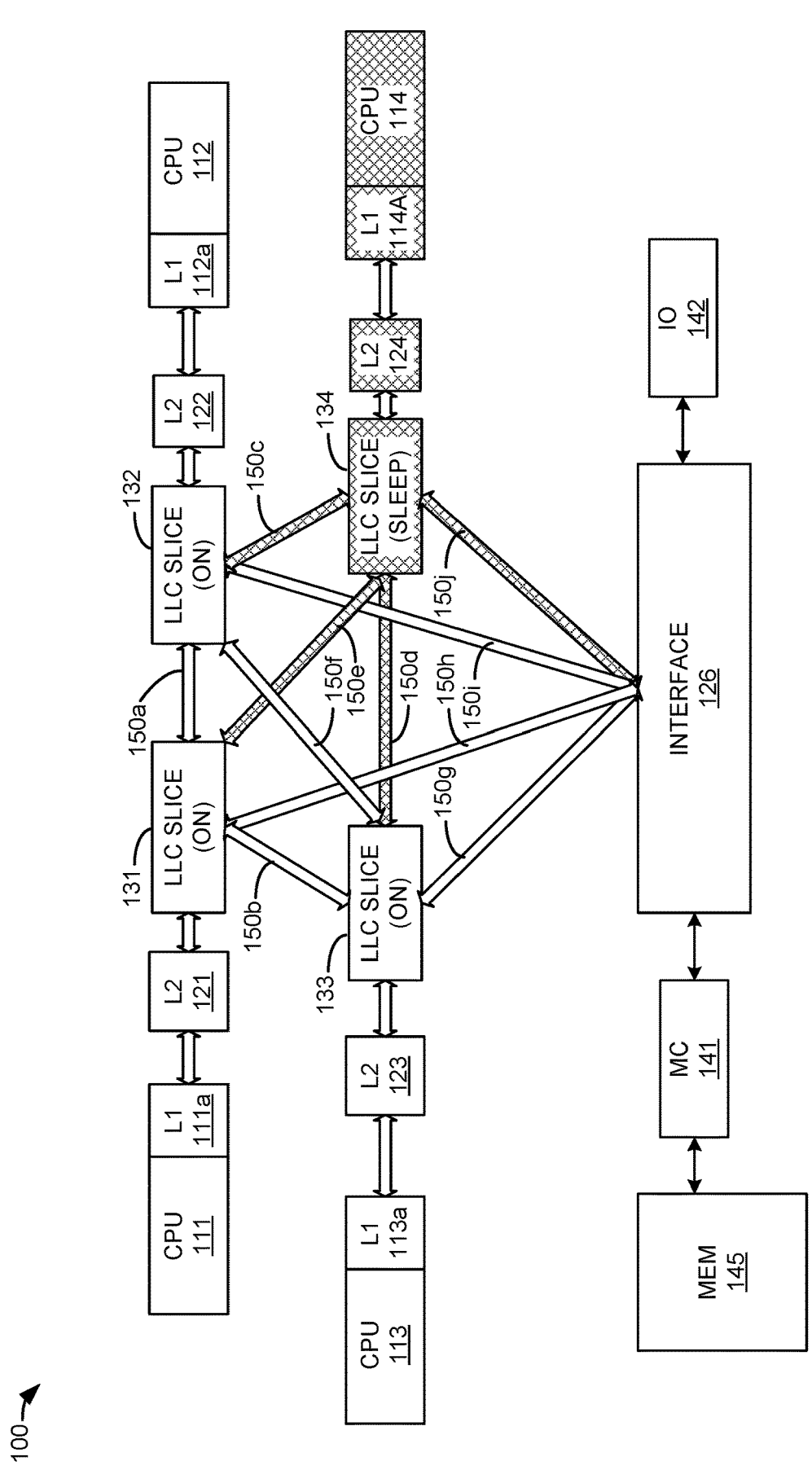

FIG. 1C is a diagram illustrating an example distribution of accesses to last-level caches using a second set of links. In FIG. 1C, last-level cache 134, L2 cache 124, and processor 114 are 'off'. To fully interconnect the remaining 'on' last-level caches 131-133 and interface 126, links 150a, 150b, 150f, 150g, 150h, and 150i are active. Links 150c, 150d, 150e, and 150j are inactive. This is illustrated by example in FIG. 1C by the crosshatch pattern of links 150c, 150d, 150e, and 150j. In FIG. 1C, processors 111-113 use a (second) cache hash function that distributes accessed data physical addresses to last-level caches 131-134. While last-level cache 134 is inactive, the links 150c, 150d, 150e, and 150j are inactivated. Thus, links 150a, 150b, 150f, 150g, 150h, and 150i are used to implement a fully interconnected mesh network that links the 'on' last-level caches 131-133 to each other and to interface 126.

Figure 1D:
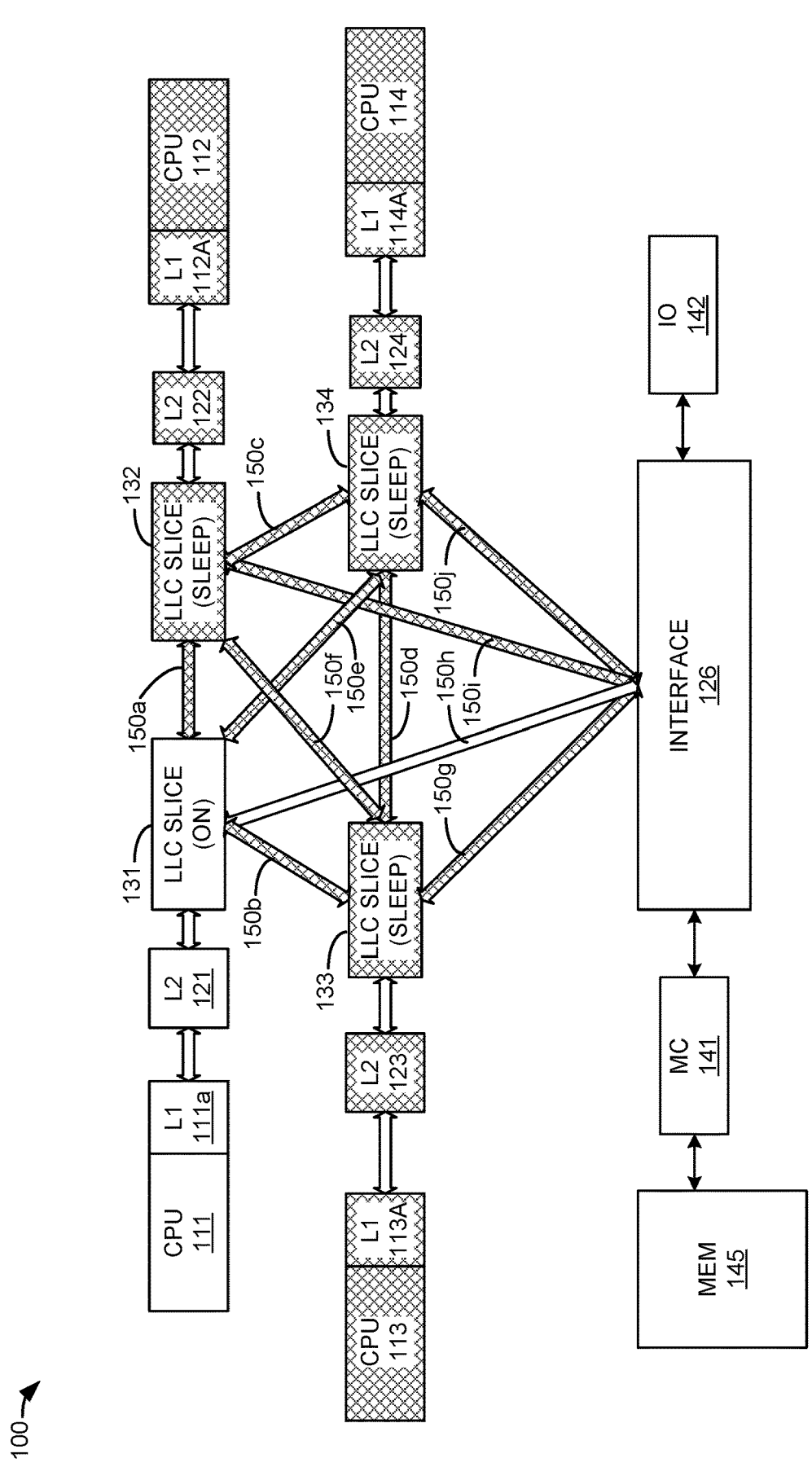

FIG. 1D is a diagram illustrating an example distribution of accesses to a single last-level caches using a third set of links. In FIG. 1D, last-level caches 132-134, L2 caches 122-124, and processors 112-114 are 'off'. To interconnect the single remaining 'on' last-level caches 131 and interface 126, link 150h is active. Links 150a-150g, 150i, and 150j are inactive. This is illustrated by example in FIG. 1D by the crosshatch pattern of links 150a-150g, 150i, and 150j. In FIG. 1D, processor 111 uses a (third) cache hash function that distributes accessed data physical addresses to last-level cache 131. While last-level caches 132-134 are inactive, the links 150a-150g, 150i, and 150j are inactivated. Thus, link 150h is used to implement a network that links the only 'on' last-level cache 131 to interface 126.

Figure 2A:
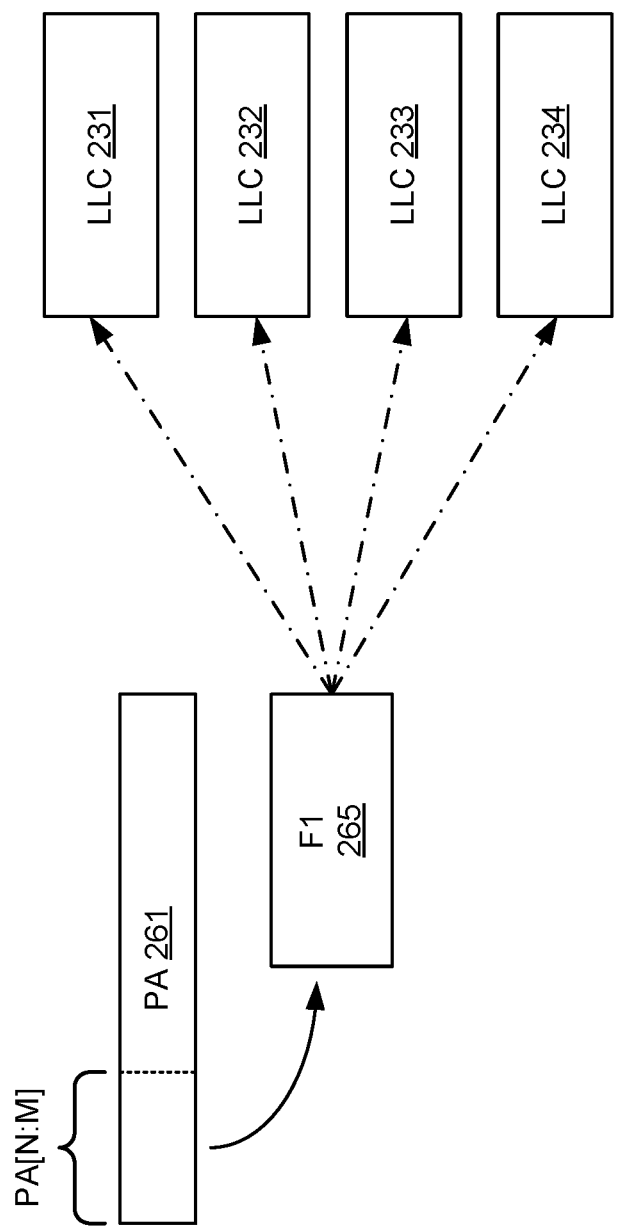
FIG. 2A illustrates a first cache hashing function that distributes accesses to all of a set of last-level caches.

FIG. 2A illustrates a first cache hashing function that distributes accesses to all of a set of last-level caches. In FIG. 2A, a field of bits (e.g., PA[N:M] where N and M are integers) of a physical address PA 261 is input to a first cache hashing function 265. Cache hashing function 265 processes the bits of PA[N:M] in order to select one of a set of last-level caches 231-234. This selected last-level cache 231-234 is to be the cache that will (or does) hold data corresponding physical address 261 as a result of cache function F1 265 being used (e.g., by processors 111-114.)

Figure 2B:
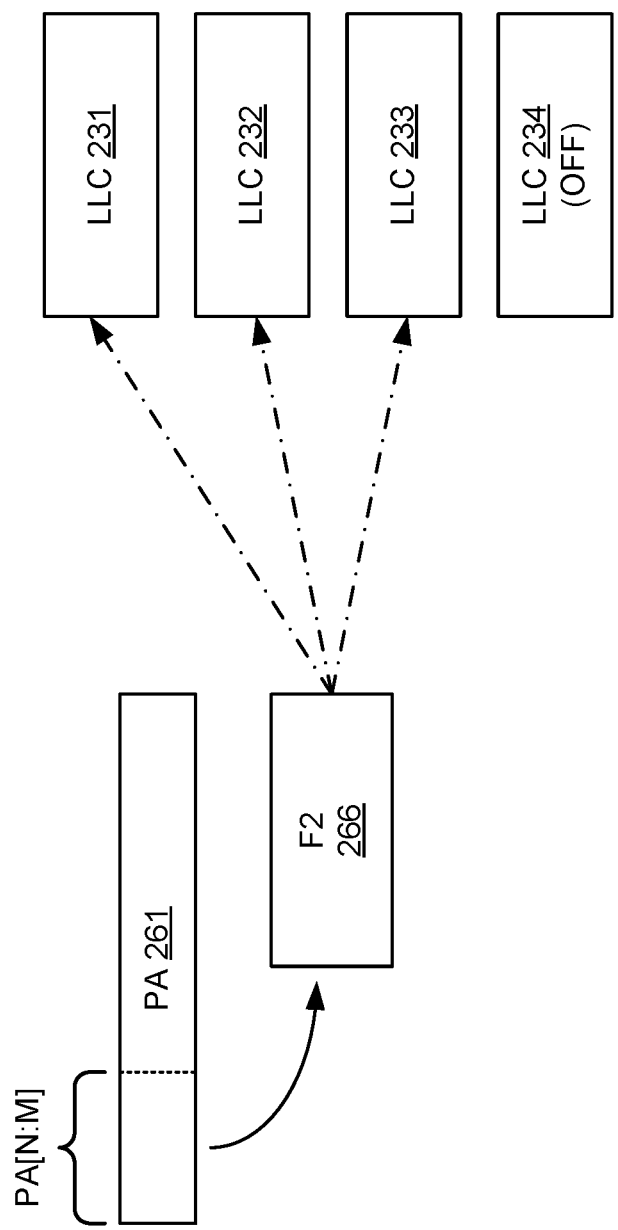
FIG. 2B illustrates a second cache hashing function that distributes accesses to a subset of the last-level caches.

FIG. 2B illustrates a second cache hashing function that distributes accesses to a subset of the last-level caches. In FIG. 2B, a field of bits (e.g., PA[N:M] where N and M are integers) of the same physical address PA 261 is input to a second cache hashing function 266. Cache hashing function 266 processes the bits of PA[N:M] in order to select one of a set of last-level caches consisting of 231, 232, and 233. This selected last-level cache is to be the cache that will (or does) hold data corresponding physical address 261 as a result of cache function F2 266 being used (e.g., by processors 111-114.) Thus, while cache hashing function 266 is being used, last-level cache 234 and the links connected to cache 234 may be turned off or placed in some other power saving mode.

Figure 2C:
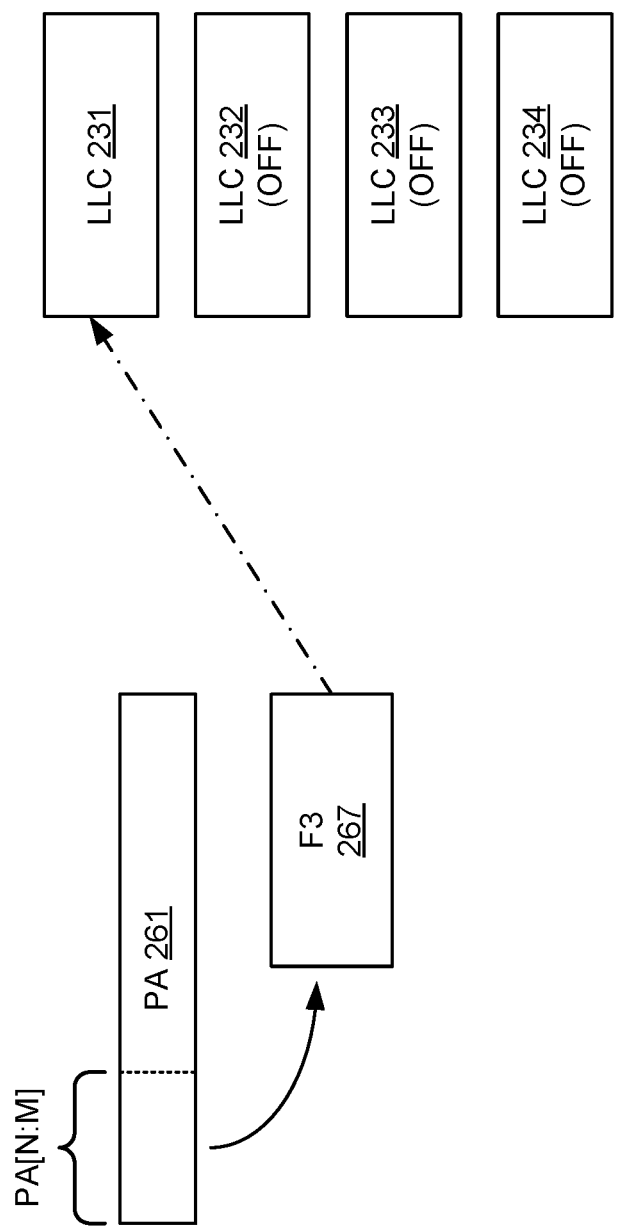
FIG. 2C illustrates function that distributes accesses to a single last-level cache.

FIG. 2C illustrates function that distributes accesses to a single last-level cache. In FIG. 2C, a field of bits (e.g., PA[N:M] where N and M are integers) of the same physical address PA 261 is input to a second cache hashing function 267. Cache hashing function 267 processes the bits of PA[N:M] in order to select last-level cache 231. Last-level cache 231 is the cache that will (or does) hold data corresponding physical address 261 as a result of cache function F3 267 being used (e.g., by processors 111-114.) In an embodiment, cache function 267 does not perform a hash to select last-level cache 267. Rather, cache function 267 selects last-level cache 231 for all values of PA[N:M]. Thus, while cache hashing function 267 is being used, last-level caches 232-234 and the links connected to them may be turned off or placed in some other power saving mode.

Figure 3:
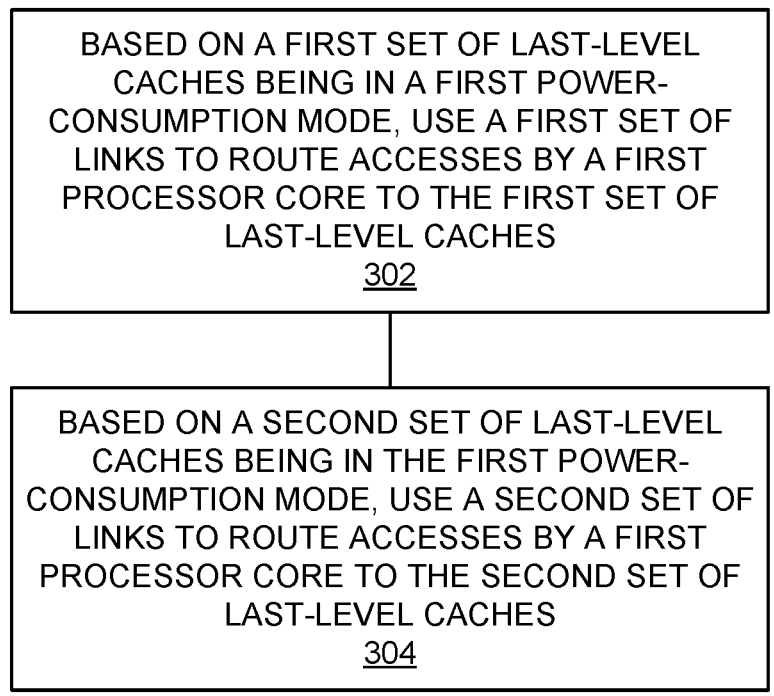
FIG. 3 is a flowchart illustrating a method of operating a processing system having a plurality of processor cores.

FIG. 3 is a flowchart illustrating a method of operating a processing system having a plurality of processor cores. The steps illustrated in FIG. 3 may be performed, for example, by one or more elements of processing system 100, and/or their components. Based on a first set of last-level caches being in a first power consumption mode, a first set of links to route accesses by a first processor core to the first set of last-level caches is used (302). For example, while all of last-level caches 131-134 are in a higher power consumption mode (e.g., 'on' and/or 'not asleep'), all of links 150a-150j may be in a higher power consumption mode (e.g., 'on' and/or 'not asleep'.) This provides an interconnect network where by any one of processors 111-114 (e.g., processor 111) can route accesses to any of last-level caches 131-134 and interface 126 via the set of 'on' links 150a-150j (e.g., processor 111 would use links 150a, 150b, 150e, and 150h.)

Based on a second set of last-level caches being in the first power consumption mode, a second set of links are used to route accesses by a first processor core to the second set of last-level caches (304). For example, while last-level cache 134 is powered down, and last-level caches 131-133 are in a higher power consumption mode, links 150a, 150b, 150f, 150g, 150h, and 150i may be active and links 150c, 150d, 150e, and 150j are inactive. This provides an interconnect network where by any one of processors 111-113 (e.g., processor 111) can route accesses to any of last-level caches 131-133 and interface 126 via the set of 'on' links 150a, 150b, 150f, 150g, 150h, and 150i (e.g., processor 111 would use links 150a, 150b, and 150h.)

Figure 4:
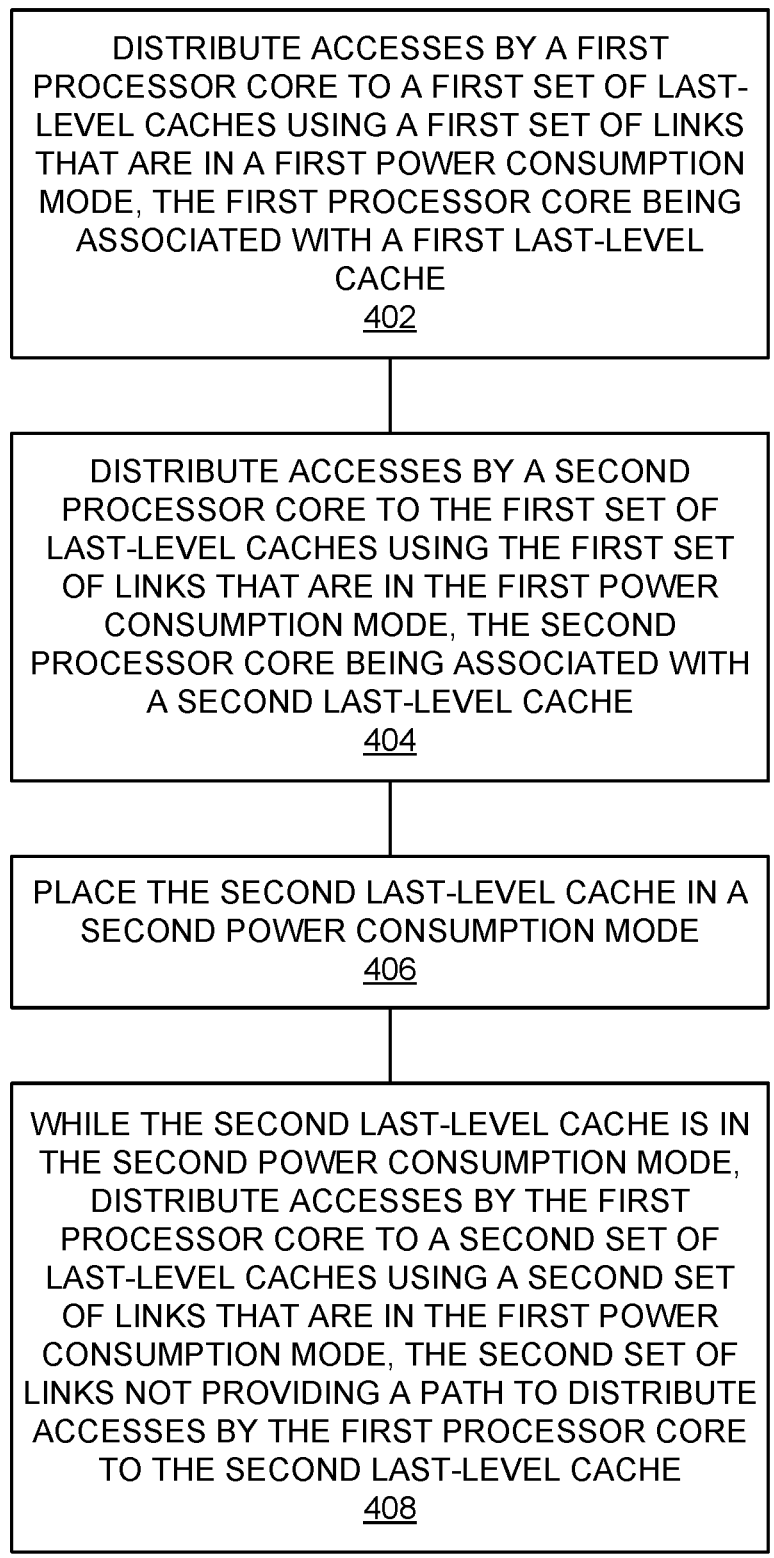
FIG. 4 is a flowchart illustrating a method of distributing accesses to a set of last-level caches to avoid powered down links.

FIG. 4 is a flowchart illustrating a method of distributing accesses to a set of last-level caches to avoid powered down links. The steps illustrated in FIG. 4 may be performed, for example, by one or more elements of processing system 100, and/or their components. By a first processor core and to a first set of last-level caches, accesses are distributed using a first set of links that are in a first power consumption mode, where the first processor core is associated with a first last-level cache (402). For example, while all of last-level caches 131-134 are in a higher power consumption mode (e.g., 'on' and/or 'not asleep'), all of links 150a-150j are in a higher power consumption mode (e.g., 'on' and/or 'not asleep') and can be used to distribute accesses. Processor 111, in particular, can use links 150a, 150b, and 150e to distribute accesses to last-level caches 132-134.

By a second processor core and to the first set of last-level caches, accesses are distributed using a first set of links that are in a first power consumption mode, where the second processor core is associated with a second last-level cache (404). For example, while all of last-level caches 131-134 are in a higher power consumption mode (e.g., 'on' and/or 'not asleep'), all of links 150a-150j are in a higher power consumption mode (e.g., 'on' and/or 'not asleep') and can be used to distribute accesses. Processor 114, in particular, can use links 150c, 150d, and 150e to distribute accesses to last-level caches 131-133.

The second last-level cache is placed in a second power consumption mode (406). For example, last-level cache 134 may be placed in a lower power (or sleep) mode. Last-level cache 134 may be placed in the lower power mode based on processor 114 being placed in a lower power mode (and/or visa versa.)

While the second last-level cache is in the second power consumption mode, accesses are distributed by the first processor core to a second set of last-level caches using a second set of links that are in the first power consumption mode, where the second set of link do not provide a path to distribute accesses by the first processor core to the second last-level cache (408). For example, while last-level cache 134 is powered down, and last-level caches 131-133 are in a higher power consumption mode, links 150a, 150b, 150f, 150g, 150h, and 150i are active and links 150c, 150d, 150e, and 150j are inactive. Processor 111, in particular, can use links 150a, and 150b to distribute accesses to last-level caches 132 and 133. However, since link 150e is inactive, processor 111 does not have a direct path to distribute accesses to last-level cache 134. Likewise, since links 150c, 150d, and 150j are also inactive, processor 111 does not have an indirect path to distribute accesses to last-level cache 134.

Figure 5:
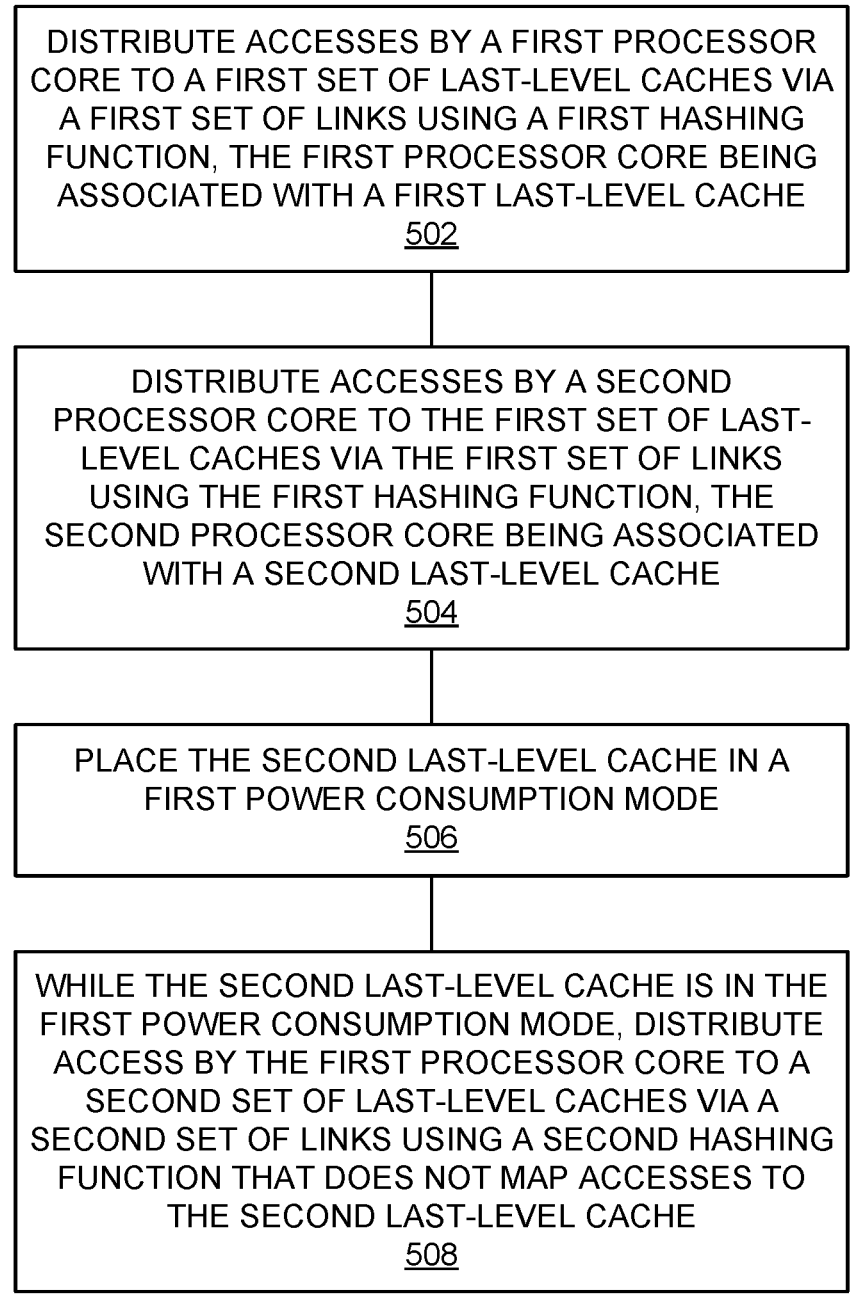
FIG. 5 is a flowchart illustrating a method of changing a cache hashing function to avoid powered down links.

FIG. 5 is a flowchart illustrating a method of changing a cache hashing function to avoid powered down links. The steps illustrated in FIG. 5 may be performed, for example, by one or more elements of processing system 100, and/or their components. Accesses are distributed by a first processor core to a first set of last-level caches via a first set of links using a first hashing function, where the first processor core is associated with a first last-level cache (502). For example, processor core 111 may use cache function 265 to distribute, by way of links 150a-150f, accesses to all of last-level caches 131-134.

Accesses are distributed by a second processor core to the first set of last-level caches via the first set of links using the first hashing function, where the first processor core is associated with a first last-level cache (504). For example, processor core 111 may use cache function 265 to distribute, by way of one or more of links 150a-150f, accesses to all of last-level caches 131-134.

The second last-level cache is placed in a first power consumption mode (506). For example, last-level cache 134 may be powered down or placed in a sleep mode. While the second last-level cache is in the first power consumption mode, accesses are distributed by the first processor core to a second set of last-level cache via a second set of links using a second hashing function that does not map accesses to the second last-level cache (508). For example, processor core 111 may use cache function 266 to distribute, by way of links 150a, 150b, and 150f, accesses to last-level caches 131-133.

The methods, systems and devices described herein may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of processing system 100, and/or processing system 400, and their components. These software descriptions may be: behavioral, register transfer, logic component, transistor, and layout geometry-level descriptions.

Data formats in which such descriptions may be implemented are stored on a non-transitory computer readable medium include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Physical files may be implemented on non-transitory machine-readable media such as: 4 mm magnetic tape, 8 mm magnetic tape, 3½-inch floppy media, CDs, DVDs, hard disk drives, solid-state disk drives, solid-state memory, flash drives, and so on.

Alternatively, or in addition, the functionally described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), multi-core processors, graphics processing units (GPUs), etc.

Figure 6:
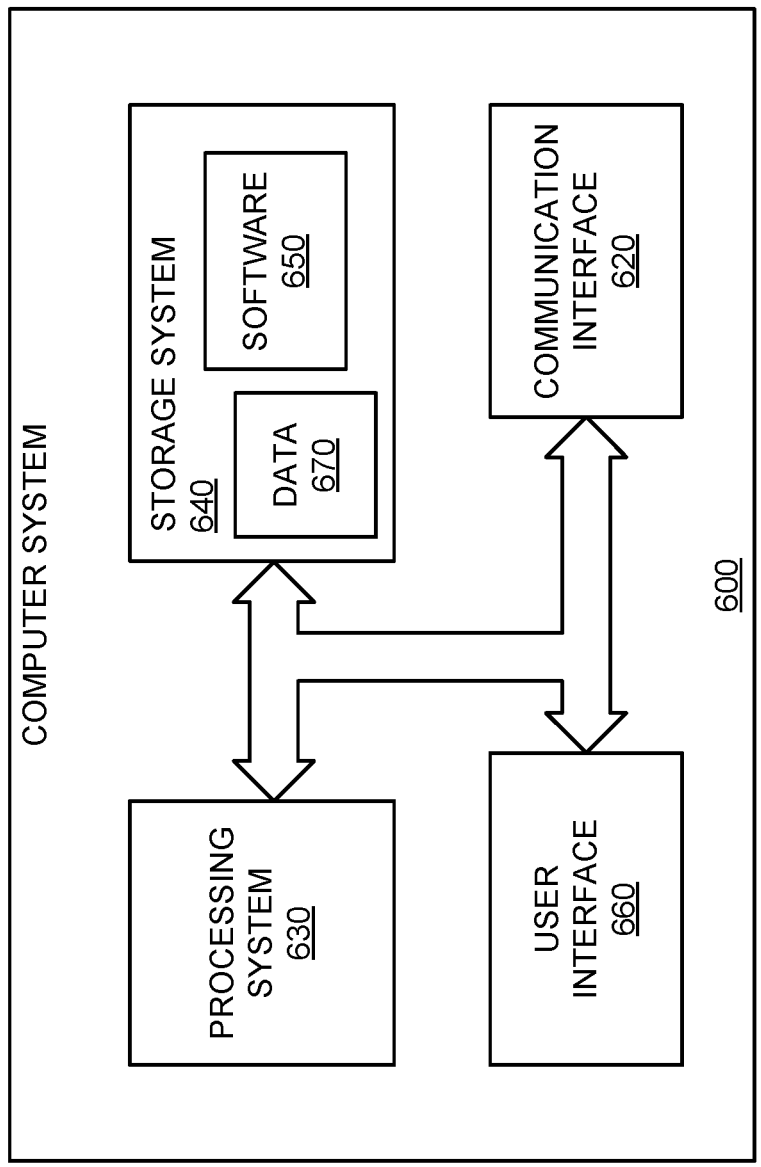
FIG. 6 is a block diagram of a computer system.

FIG. 6 is a block diagram of a computer system. In an embodiment, computer system 600 and/or its components include circuits, software, and/or data that implement, or are used to implement, the methods, systems and/or devices illustrated in the Figures, the corresponding discussions of the Figures, and/or are otherwise taught herein.

FIG. 6 illustrates a block diagram of an example computer system. In an embodiment, computer system 600 and/or its components include circuits, software, and/or data that implement, or are used to implement, the methods, systems and/or devices illustrated in the Figures, the corresponding discussions of the Figures, and/or are otherwise taught herein.

Computer system 600 includes communication interface 620, processing system 630, storage system 640, and user interface 660. Processing system 630 is operatively coupled to storage system 640. Storage system 640 stores software 650 and data 670. Processing system 630 is operatively coupled to communication interface 620 and user interface 660. Processing system 630 may be an example of one or more of processing system 100, and/or its components.

Computer system 600 may comprise a programmed general-purpose computer. Computer system 600 may include a microprocessor. Computer system 600 may comprise programmable or special purpose circuitry. Computer system 600 may be distributed among multiple devices, processors, storage, and/or interfaces that together comprise elements 620-670.

Communication interface 620 may comprise a network interface, modem, port, bus, link, transceiver, or other communication device. Communication interface 620 may be distributed among multiple communication devices. Processing system 630 may comprise a microprocessor, microcontroller, logic circuit, or other processing device. Processing system 630 may be distributed among multiple processing devices. User interface 660 may comprise a keyboard, mouse, voice recognition interface, microphone and speakers, graphical display, touch screen, or other type of user interface device. User interface 660 may be distributed among multiple interface devices. Storage system 640 may comprise a disk, tape, integrated circuit, RAM, ROM, EEPROM, flash memory, network storage, server, or other memory function. Storage system 640 may include computer readable medium. Storage system 640 may be distributed among multiple memory devices.

Processing system 630 retrieves and executes software 650 from storage system 640. Processing system 630 may retrieve and store data 670. Processing system 630 may also retrieve and store data via communication interface 620. Processing system 650 may create or modify software 650 or data 670 to achieve a tangible result. Processing system may control communication interface 620 or user interface 660 to achieve a tangible result. Processing system 630 may retrieve and execute remotely stored software via communication interface 620.

Software 650 and remotely stored software may comprise an operating system, utilities, drivers, networking software, and other software typically executed by a computer system. Software 650 may comprise an application program, applet, firmware, or other form of machine-readable processing instructions typically executed by a computer system. When executed by processing system 630, software 650 or remotely stored software may direct computer system 600 to operate as described herein.

Implementations discussed herein include, but are not limited to, the following examples:

Example 1

An integrated circuit, comprising: a plurality of last-level caches that can be placed in at least a first high cache-power consumption mode and a first low cache-power consumption mode, the plurality of last-level caches including a first last-level cache and a second last-level cache; a plurality of processor cores to access data in the plurality of last-level caches; and, an interconnect network, comprised of a plurality of point-to-point links that can be placed in at least a first high link-power consumption mode and a first low link-power consumption mode, to receive access addresses from the plurality of processor cores and to couple, via respective subsets of the plurality of point-to-point links, each of the plurality of processor cores to a respective one of the plurality of last-level caches, a first subset of the plurality of point-to-point links to be placed in the first low link-power consumption mode based at least in part on the first last-level cache being in the first low cache-power consumption mode.

Example 2

The integrated circuit of example 1, wherein the plurality of processor cores are to access data in the plurality of last-level caches according to a first hashing function that maps processor access addresses to respective ones of the plurality of last-level caches based at least in part on all of the last-level caches being in the first high power consumption mode, the plurality of processor cores to access data in the plurality of last-level caches according to a second hashing function that maps processor access addresses to a subset of the plurality of last-level caches based at least in part on the first last-level cache being in the first low cache-power consumption mode.

Example 3

The integrated circuit of example 1, wherein a first processor core of the plurality of processor cores is more tightly coupled to the first last-level cache than to a first set of last-level caches of the plurality of last-level caches.

Example 4

The integrated circuit of example 3, wherein the first subset of the plurality of point-to-point links comprise at least one point-to-point link used to couple the first last-level cache to at least one of the first set of last-level caches.

Example 5

The integrated circuit of example 4, wherein the plurality of point-to-point links are configured as a fully connected mesh and the first subset includes ones of the plurality of point-to-point links that directly couple the first last-level cache to the first set of last-level caches.

Example 6

The integrated circuit of example 3, wherein the first set last-level caches that are not more tightly coupled to the first processor core than the first last-level cache includes the second last-level cache, a second processor core of the plurality of processor cores being more tightly coupled to the second last-level cache than to a second set of last-level caches of the plurality of last-level caches.

Example 7

The integrated circuit of example 6, wherein the first subset of the plurality of point-to-point links includes pointto-point links used to couple the first last-level cache to the first subset and does not include point-to-point links used to couple the second last-level cache to the second subset.

Example 8

A method of operating a processing system having a plurality of processor cores, comprising: based at least in part on a first set of last-level caches of a plurality of last-level caches being in a first power consumption mode, using a first set of links to route accesses by a first processor core of the plurality of processor cores to the first set of last-level caches; and, based at least in part on a second set of last-level caches of the plurality of last-level caches being in the first power consumption mode, using a second set of links to route accesses by the first processor core to the second set of last-level caches.

Example 9

The method of example 8, wherein the first processor core is more tightly coupled to a first one of the plurality of last-level caches than to other last-level caches of the plurality of last-level caches.

Example 10

The method of example 9, wherein the first one of the plurality of last-level caches is in both the first set of last-level caches and the second set of last-level caches.

Example 11

The method of example 8, wherein the first processor core is more tightly coupled to a first one of the plurality of last-level caches than to other last-level caches of the plurality of last-level caches and a second processor core is more tightly coupled to a second one of the plurality of last-level caches than to other last-level caches of the plurality of last-level caches.

Example 12

The method of example 11, wherein the second last-level cache is in the first set of last-level caches and is not in the second set of last-level caches.

Example 13

The method of example 12, wherein a difference between the second set of links and the first set of links includes at least one link used to route accesses between the first processor core and the second last-level cache.

Example 14

The method of example 13, wherein the first set of links are configured to form a fully connected mesh network between the first processor core of the plurality of processor cores and the first set of last-level caches, and the second set of links are configured to form a fully connected mesh network between the first processor core of the plurality of processor cores and the second set of last-level caches.

Example 15

The method of example 14, wherein the second set of links are configured such that the second set of links does not route accesses by the first processor core to the second last-level cache.

Example 16

A method of operating a plurality of processor cores on an integrated circuit, comprising: distributing accesses by a first processor core to a first set of last-level caches of a plurality of last-level caches using a first set of links that are in a first power consumption mode, the first processor core associated with a first last-level cache of the plurality of last-level caches; distributing accesses by a second processor core to the first set of last-level caches using the first set of links that are in the first power consumption mode, the second processor core associated with a second last-level cache of the plurality of last-level caches; placing the second last-level cache in a second power consumption mode; and, while the second last-level cache is in the second power consumption mode, distributing accesses by the first processor core to a second set of last-level caches using a second set of links that are in the first power consumption mode, the second set of links not providing a path to distribute accesses by the first processor core to the second last-level cache.

Example 17

The method of example 16, wherein the first set of links that are in the first power consumption mode fully connect the first processor core to the first set of last-level caches and the first set of last-level caches includes the second last-level cache.

Example 18

The method of example 17, wherein the second set of links that are in the first power consumption mode fully connect the first processor core to the second set of last-level caches and the second set of last-level caches does not include the second last-level cache.

Example 19

The method of example 16, wherein while the second last-level cache is in the second power consumption mode, a third set of links are in a low power consumption mode.

Example 20

The method of example 19, wherein the third set of links is to be included in the first set of links and is not to be included in the second set of links.

The foregoing descriptions of the disclosed embodiments have been presented for purposes of illustration and description. They are not intended to be exhaustive or to limit the scope of the claimed subject matter to the precise form(s) disclosed, and other modifications and variations may be possible in light of the above teachings. The embodiments were chosen and described in order to best explain the principles of the disclosed embodiments and their practical application to thereby enable others skilled in the art to best utilize the various embodiments and various modifications as are suited to the particular use contemplated. It is intended that the appended claims be construed to include other alternative embodiments except insofar as limited by the prior art.

The invention claimed is:

1. An integrated circuit, comprising:
   a plurality of last-level caches that can be placed in at least a high cache-power consumption mode and a low cache-power consumption mode, the plurality of last-level caches including a first last-level cache and a second last-level cache;
   a plurality of processor cores configured to access data in the plurality of last-level caches; and
   an interconnect network, comprised of a plurality of links that can be placed in at least a high link-power consumption mode and a low link-power consumption mode, the interconnect network configured to receive access addresses from the plurality of processor cores and to couple, via respective subsets of the plurality of links, each of the plurality of processor cores to a respective one of the plurality of last-level caches, and to cause a first subset of the plurality of links to be placed in the low link-power consumption mode based at least in part on the first last-level cache being in the low cache-power consumption mode.

2. The integrated circuit of claim 1, wherein the plurality of links is connected in a fully-connected mesh topology.

3. The integrated circuit of claim 1, wherein the plurality of links is connected in a star topology.

4. The integrated circuit of claim 1, wherein the plurality of links is connected in a ring topology.

5. The integrated circuit of claim 1, wherein the plurality of links is connected in a crossbar topology.

6. The integrated circuit of claim 1, wherein the plurality of links is connected in a hybrid topology including network portions having one or more of a mesh topology, a star topology, a ring topology, and a crossbar topology.

7. The integrated circuit of claim 1, wherein the plurality of links includes one or more point-to-point links.

8. A method of operating a processing system having a plurality of processor cores, comprising:
   based at least in part on an initial portion of a cache being in an available power consumption mode and an alternate portion of the cache being in a reduced power consumption mode, routing accesses to the cache by a first processor core of the plurality of processor cores via the initial portion of the cache; and
   based at least in part on the alternate portion of the cache being placed in the available power consumption mode, routing accesses to the cache by the first processor core via the alternate portion of the cache.

9. The method of claim 8, wherein the alternate portion of the cache is associated with a second processor core, the method further comprising placing the alternate portion of the cache in the available power consumption mode responsive to the second processor core being in the available power consumption mode.

10. The method of claim 8, wherein the alternate portion of the cache is associated with a second processor core, the method further comprising placing the second processor core in the available power consumption mode responsive to alternate portion of the cache being in the available power consumption mode.

11. The method of claim 8, wherein routing accesses to the cache is controlled by a hash function, and wherein the hash function is changed according to whether the alternate portion of the cache is in the available power consumption mode.

12. The method of claim 8, wherein the alternate portion of the cache includes one or more of a circuit link and a last-level cache, and the initial portion of the cache excludes one or both of the circuit link and the last-level cache.

13. The method of claim 12, further comprising, while the last-level cache is in the available power consumption mode, placing the circuit link in the available power consumption mode.

14. The method of claim 12, wherein routing accesses to the cache is controlled by a hash function, and wherein the hash function is changed according to whether zero, one, or both of the last-level cache and the circuit link are in the available power consumption mode.

15. A method of operating a plurality of processor cores on an integrated circuit, comprising:
   distributing accesses by a first processor core to a cache via an initial portion of the cache including one or more of a circuit link and a last-level cache associated with the first processor core;
   distributing accesses by a second processor core to the cache via the initial portion of the cache;
   placing one or both of the circuit link and the last-level cache in a reduced power consumption mode; and,
   while one or both of the circuit link and the last-level cache is in the reduced power consumption mode, distributing accesses by the second processor core to the cache via an alternate portion of the cache that excludes one or both of the circuit link and the last-level cache.

16. The method of claim 15, further comprising placing one or both of the circuit link and the last-level cache in the reduced power consumption mode responsive to the first processor core being in the reduced power consumption mode.

17. The method of claim 15, further comprising placing the first processor core in the reduced power consumption mode responsive to one or both of the circuit link and the last-level cache being in the reduced power consumption mode.

18. The method of claim 15, further comprising placing the circuit link in the reduced power consumption mode responsive to the last-level cache being in the reduced power consumption mode.

19. The method of claim 18, wherein the circuit link is one of a set of circuit links associated with the last-level cache, the method further comprising placing the set of circuit links in the reduced power consumption mode.

20. The method of claim 15, wherein distributing accesses to the cache is controlled by a hash function, and wherein the hash function is changed according to whether zero, one, or both of the last-level cache and the circuit link are in the reduced power consumption mode.

* * * * *